(12) United States Patent  (10) Patent No.: US 7,924,074 B2
Watarai (45) Date of Patent: Apr. 12, 2011

(54) DELAY CONTROL CIRCUIT AND DELAY CONTROL METHOD

(75) Inventor: Seiichi Watarai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 120 days.

(21) Appl. No.: 12/314,910

(22) Filed: Dec. 18, 2008

(65) Prior Publication Data

US 2009/0160512 A1 Jun. 25, 2009

(30) Foreign Application Priority Data

Dec. 20, 2007 (JP) ................................ 2007-328916

(51) Int. Cl.
*H03L 7/06* (2006.01)
(52) U.S. Cl. ........................................ 327/158; 327/149
(58) Field of Classification Search .................... 327/158
See application file for complete search history.

(56) References Cited

U.S. PATENT DOCUMENTS

| 5,684,421 | A | 11/1997 | Chapman et al. | |
| 7,227,809 | B2 * | 6/2007 | Kwak | ....................... 365/189.15 |
| 2001/0035784 | A1 | 11/2001 | Watarai | |

FOREIGN PATENT DOCUMENTS

| JP | 11-513847 | 11/1999 |
| JP | 2001-285266 | 10/2001 |
| WO | WO 97/14214 | 4/1997 |

* cited by examiner

*Primary Examiner* — Lincoln Donovan
*Assistant Examiner* — Daniel Rojas
(74) *Attorney, Agent, or Firm* — McGinn Intellectual Property Law Group, PLLC

(57) ABSTRACT

A delay control circuit in which steady phase error can be eliminated has a first variable delay circuit and a first phase control circuit. The delay control circuit further includes a second variable delay circuit disposed in either a first or second clock path, and a second phase control circuit arranged so as to form an additional feedback loop, which is for canceling steady phase error produced by the first phase control circuit, with respect to the first clock path or second clock path using a delay value applied to the second variable delay circuit.

20 Claims, 20 Drawing Sheets

DELAY CONTROL CIRCUIT AND DELAY CONTROL METHOD

REFERENCE TO RELATED APPLICATION

This application is based upon and claims the benefit of the priority of Japanese patent application No. 2007-328916, filed on Dec. 20, 2007, the disclosure of which is incorporated herein in its entirety by reference thereto.

TECHNICAL FIELD

This invention relates to a delay control circuit and delay control method. More particularly, the invention relates to a delay control circuit and delay control method for outputting at least one clock signal the phase of which has been controlled in units of a prescribed delay difference (resolution) with respect to a reference clock signal having a prescribed frequency.

BACKGROUND

Delay control circuits are in widespread use as means for outputting a plurality of clocks having a prescribed delay difference (resolution) with respect to a reference clock signal. One application is a CDR (Clock Data Recovery) circuit characterized by oversampling. It is required that the characteristic of the plurality of clocks used be such that phase difference is not affected by fluctuations in temperature, power supply voltage and discrepancies in process manufacture and such that resolution (power) has a fine value on the order of several tens of picoseconds.

There are instances where a DLL (Delay-Locked Loop) is used as an example of such a delay control circuit. For example, a digital phase control circuit described in Patent Document 1 can be mentioned. FIG. 15 is a circuit diagram of the digital phase control circuit of Patent Document 1. The circuit is composed of a delay-locked loop (DLL1) having a resolution of 160 ps and a delay-locked loop (DLL2) having a resolution of 200 ps.

[Patent Document 1]
Japanese Patent Kokai Publication No. JP-P2001-285266A

[Patent Document 2]
Japanese Patent Kohyo Publication No. JP-A-11-513847

SUMMARY

The disclosure of the above Patent Documents are incorporated herein by reference thereto. Now, the following analyses are given by the present invention.

Assume that DLL1 selectively outputs a clock via delay buffers G1 and G2 and that the DLL2 selectively outputs this clock via delay buffers H1 and H2. In this case a clock having a delay of 160 ps×2+200 ps×2=720 ps with respect to the input (IN) will be output from the output (OUT). Next, assume that DLL1 selectively outputs a clock via delay buffers G1, G2 and G3 and that the DLL2 selectively outputs this clock via the delay buffer H1 alone. In this case a clock having a delay of 160 ps×3+200 ps=680 ps with respect to the input (IN) will be output from the output (OUT). That is, a phase difference of 40 ps is produced depending upon the selection of the buffers within each of the DLLs. In this example the total delay time of the DLL1 and DLL2 is shortened by 40 ps and therefore the phase shift is expressed as −40 ps (phase is advanced) for the sake of description.

Since a resolution of 40 ps is obtained in the arrangement of Patent Document 1, the phase differences (200 ps and 160 ps) of the clock produced by respective ones of the two DLLs are fixed values that are not influenced by temperature, power supply voltage and variations in process manufacture.

FIG. 16 is a circuit diagram in which DLL2 has been excerpted from FIG. 15. In FIG. 16, a plurality of clocks are generated and output from variable delay circuits 1 to 8 of a VCDL (Voltage-Controlled Delay Line) that constitutes the DLL. The DLL shown in FIG. 16 comprises differential buffers each having a complementary signal pair of positive/negative clocks. The phase relationship between IN and INB serving as reference inputs and the phase relationship between OTn and OBn (n is 1 to 8) which are the outputs is complementary, i.e., the signals are opposite in phase. In FIG. 16, a circuit (PD2+CP2) having the functions of a phase comparator (PD2) and charge pump (CP2) detects the phase difference between the input signal (IN, INB) and output (OT8, OB8) of variable delay circuit 8 of the VCDL, converts the phase difference to a control current value and outputs the control current value. A circuit (LPF2) having the function of a low-pass filter integrates the control current value and converts it to a control voltage (VC2). The control voltage (VC2) is fed back to each variable delay circuit of the VCDL and controls the delay time of the VCDL2.

FIG. 17 is a timing chart of the DLL shown in FIG. 16. For the sake of expediency in terms of description, only positive-phase outputs (OT2, OT4, OT6, OT8) of the respective variable delay circuits 2, 4, 6, 8 of the VCDL and phase-comparison targets (IN, OB8) are shown. The phase difference of the output OTn (n is 1 to 8) from each variable delay circuit of the VCDL is 200 ps, and the complementary output OBn (n is 1 to 8) is opposite in phase with respect to OTn (n is 1 to 8). That is, FIG. 17 indicates that phase control is performed based upon a delay (200 ps) obtained by dividing a half period (1600 ps) of the reference clock by the number of stages (eight) of the VCDL, and illustrates the outputs of even-numbered stages of the variable delay circuits of this VCDL.

FIG. 18 is a diagram illustrating the operation of the phase comparator (PD2) and charge pump (CP2) used in the DLL of FIG. 16. FIG. 18 illustrates the relationship of control current value to phase difference between two complementary-pair clock input terminals (1, $\bar{1}$ and 2, $\bar{2}$) in the phase comparator and charge pump (PD2+CP2). Here one inverted (complementary) clock is supplied to input terminal $\bar{1}$, two inverted (complementary) clocks are supplied to input terminal $\bar{2}$, and the signs of the phase differences of the respective clocks and signs of the control output currents are indicated in the timing chart and graph. As for the targets of phase comparison of this circuit (PD2+DP2), it is assumed that a phase comparison is performed between the complementary input terminals (2, $\bar{2}$ with respect to 1, $\bar{1}$) at the same rising edge or same falling edge between −π and +π. For example, the phase comparison targets in FIG. 17 are IN and OB8. A clock opposite in phase to OT8 is used with respect to IN, and the rising and falling edges of the phase comparison targets are made to conform to −π and +π. As a result, the DLL can be phase-locked in a half period of the reference clock. Accordingly, it is necessary to supply reversed clocks to the input terminals (1, $\bar{1}$) of the circuit (PD2+CP2), as illustrated in FIG. 18. In FIG. 16, therefore, the connections of OT8 and OB8 are reversed (OB8 is made 1 and OT8 is made $\bar{1}$).

SUMMARY

However, a problem has been found with the delay control circuit using the above-described DLL that an error delay or so-called steady phase error occur and an accurate resolution cannot be obtained when phase control is carried out. The steady phase error means that a delay between phase comparison clocks will not be zero in FIG. 16 owing to the fact that the characteristic of the phase comparator and charge pump (PD2+CP2) changes because of the influence of a fluctuation in temperature, power supply voltage and discrepancies in process manufacture.

FIG. 19 is a timing chart of a case where steady phase error (−200 ps) has occurred in the circuit arrangement of FIG. 16. In FIG. 19, the output of each variable delay circuit of the VCDL constituting the DLL is such that the phase difference of each variable delay circuit fluctuates by 25 ps owing to occurrence of steady phase error (−200 ps), and that the phase difference between the last stage (OT8) of the VCDL and the reference clock is shifted by the steady phase error (−200 ps) as is.

Next, consider a case where steady phase error has occurred in the arrangement (FIG. 15) of Patent Document 1 described earlier. In FIG. 15, assume that a steady phase error of −200 ps has developed in the DLL1. In this case, the phase difference of the VCDL of each DLL becomes (1600 ps+200 ps)/10=180 ps in DLL1 and (1600 ps−200 ps)/8=175 ps in DLL2.

Here an attempt will be made to calculate a resolution similar to that of the case of Patent Document 1 under these conditions. First, assume that DLL1 selectively outputs a clock via delay buffers G1 and G2 and that the DLL2 selectively outputs this clock via delay buffers H1 and H2. In this case a clock having a delay of 180 ps×2+175 ps×2=710 ps with respect to the input (IN) will be output from the output (OUT). Next, assume that DLL1 selectively outputs a clock via delay buffers G1, G2 and G3 and that the DLL2 selectively outputs this clock via the delay buffer H1 alone. In this case a clock having a delay of 180 ps×3+175 ps=715 ps with respect to the input (IN) will be output from the output (OUT). That is, a phase difference of 5 ps is produced depending upon the selection of the buffers within each of the DLLs. In this example the total delay time of the DLL1 and DLL2 is lengthened by 5 ps and therefore the phase shift is expressed as +5 ps (phase is delayed) for the sake of convenience.

The phase difference in a case where there is no steady phase error described earlier was −40 ps. In other words, owing to the occurrence of steady phase error, the result is that phase is delayed by 5 ps despite the fact that a setting to advance phase by 40 ps has been selected. That is, a problem with the delay control circuit of Patent Document 1 is not only a decline in precision of resolution of the multiphase clocks owing to occurrence of steady phase error but also an error in the direction of the phase shift.

A method of eliminating steady phase error has also been proposed. A method described in Patent Document 2 can be mentioned as an example. FIG. 20 is a circuit diagram of a timing vernier described in Patent Document 2. The arrangement of FIG. 20 incorporates a function that corrects for steady phase error, which occurs in a phase-locked control circuit 14, using delay circuits 16 and 18. By adjusting error data supplied to a delay control circuit 20 in FIG. 20, delay in the delay circuit 16 is, e.g., enlarged and delay in the delay circuit 18 is reduced, thereby making it possible to eliminate steady phase error.

However, with the correction of the steady phase error in Patent Document 2, as described on page 13 of this patent document, the user must previously monitor the steady phase error using an oscilloscope or the like, and manual operation of the error data supplied to the delay control circuit 20 must be carried out so as to eliminate steady phase error. In this case, the manual operation is necessary for every device equipped with this delay control circuit, and the user must perform monitoring constantly and correct steady phase error also with regard periodic fluctuations in the temperature of the apparatus environment and power supply voltage. That is, the problem with the timing vernier described in Patent Document 2 is that it also does not having a function for detecting steady phase error and automatically correcting steady phase error.

Therefore, there is much to be desired in the art.

According to a first aspect of the present invention, there is provided a delay control circuit in which are formed a first clock path in which a first variable delay circuit is disposed and a second clock path in which the first variable delay circuit does not intervene, and which is provided with a first phase control circuit for matching a phase of a first clock that is output from the first clock path and a phase of a second clock that is output from the second clock path, in which the first variable delay circuit does not intervene, using a delay value of the first variable delay circuit. The delay control circuit further comprises: a second variable delay circuit disposed in either one of the first and second clock paths; and a second phase control circuit arranged so as to form an additional feedback loop, which is for canceling steady phase error produced by the first phase control circuit, with respect to the first clock path or second clock path using a delay value of the second variable delay circuit.

Since the amount of control of the second variable delay circuit by the second phase control (control quantity) to circuit includes a steady phase error produced by the second phase control circuit, the result is that steady phase error in the first phase control circuit is eliminated.

According to a second aspect of the present invention, there is provided a method of eliminating steady phase error in a delay control circuit having a first phase control circuit for matching the phase of a first clock that is output from a first clock path in which a first variable delay circuit is disposed, and a phase of a second clock that is output from a second clock path in which the first variable delay circuit does not intervene. The method of eliminating steady phase error comprises: as a first step, matching the phases of the first and second clocks by the first phase control circuit using a delay value applied to the first variable delay circuit; and as a second step, matching a phase of a third clock, which is output from the first clock path or second clock path from any position inclusive of starting and end points thereof, and a phase of a fourth clock, which is output from a second variable delay circuit disposed in either one of the first and second clock paths, by adjusting a delay value, which is applied to the second variable delay circuit, by a second phase control circuit provided separate from the first phase control circuit.

The meritorious effects of the present invention are summarized as follows.

In accordance with the present invention, steady phase error can be eliminated automatically. The reason for this is the provision of an additional circuit in which an additional (second) phase adjustment for eliminating steady phase error produced by the first phase control circuit is carried out with respect to either of the first and second clock paths by the second variable delay circuit and the second phase control circuit provided separate from the first variable delay circuit and the first phase control circuit. Further, since the second variable delay circuit can be disposed in either the first clock path or the second clock path, design of the delay control circuit is facilitated, the scale of the circuitry is reduced and less power consumed in comparison with the case where other means for canceling steady phase error is employed.

Other features and advantages of the present invention will be apparent from the following description taken in conjunction with the accompanying drawings, in which like reference characters designate the same or similar parts throughout the figures thereof.

PREFERRED MODES OF THE INVENTION

Figure 1:
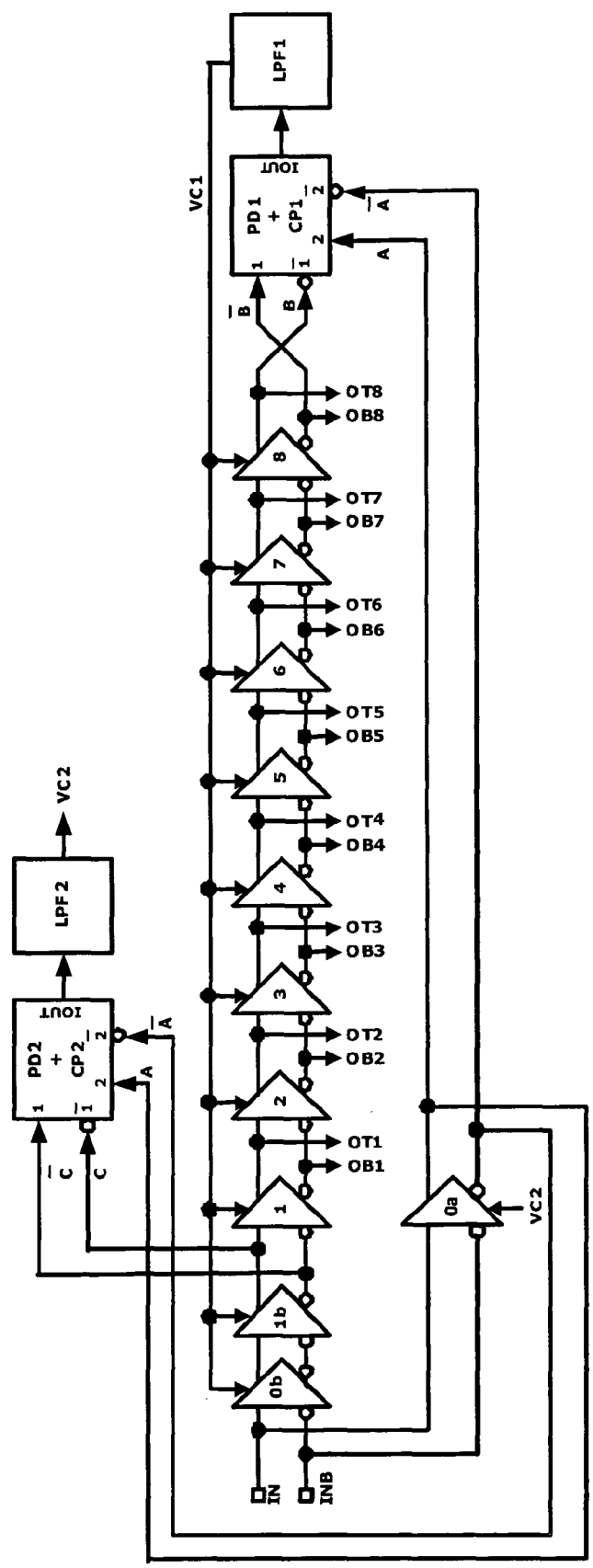
FIG. 1 is a diagram illustrating the circuit configuration of a delay control circuit according to a first exemplary embodiment of the present invention.

Various modes of the present invention will be described below.

(Mode 1)

A delay control circuit according to one mode of the present invention includes: an input terminal to which a clock is supplied; a first clock path connected to the input terminal and passing through a first variable delay circuit; a second clock path connected to the input terminal; a second variable delay circuit; a first phase control circuit for matching a phase of a first clock, which has been output through the first clock path, and a phase of a second clock, which has been output through the second clock path, by controlling the delay value of the first variable delay circuit; and a second phase control circuit for matching a phase of a third clock, which is output from the first clock path from any position inclusive of starting and end points thereof, and a fourth clock, which is output from the second clock path from any position inclusive of starting and end points thereof, or a phase of the first clock and a phase of the third clock, by controlling the delay value of the second variable delay circuit; wherein the second variable delay circuit is provided in either the first clock path or the second clock path.

(Mode 2).

An arrangement can be adopted in which the second variable delay circuit is inserted in the first clock path between the input terminal and the first variable delay circuit, the second phase control circuit is supplied with a third clock and a fourth clock, the third clock is the output clock of the second variable delay circuit, and the fourth clock is the end point of the second clock path.

(Mode 3)

An arrangement can be adopted in which the second variable delay circuit is inserted in the first clock path between an output of the first variable delay circuit and the first phase control circuit, the second phase control circuit is supplied with the first clock and third clock, and the third clock is an input clock of the second variable delay circuit.

(Mode 4)

An arrangement can be adopted in which the second variable delay circuit is inserted in a second clock path, the second phase control circuit is supplied with a third clock and fourth clock, the third clock is an input clock of the first variable delay circuit and the fourth clock is the end point of the second clock path.

(Mode 5)

An arrangement can be adopted in which a third delay circuit for adjusting the delay of the first clock path is inserted in the first clock path.

(Mode 6)

An arrangement can be adopted in which a fourth delay circuit for adjusting the delay of the second clock path is inserted in the second clock path.

(Mode 7)

An arrangement can be adopted in which a third delay circuit and fourth delay circuit have their delays controlled by the first phase control circuit.

(Mode 8)

An arrangement can be adopted in which the phase of the clock supplied to the first phase control circuit is nπ (where n an odd number) or mπ (where m is an even number).

(Mode 9)

An arrangement can be adopted in which the first variable delay circuit is constituted by x stages (where x is an integer) of delay buffers having identical characteristics, and each delay buffer outputs an output clock.

(Mode 10)

It is preferred that a first error delay value produced by the first phase control circuit and a second error delay value produced by the second phase control circuit be substantially equal (equal or values that are nearly equal to each other).

(Mode 11)

An arrangement can be adopted in which the first phase control circuit and second phase control circuit have the same circuit form (or formulation), the same element dimensions and the same layout.

Modifications set forth below can be made so long as the first error delay produced by the first phase control circuit is cancelled by the second error delay produced by the second phase control circuit. As a result, delay times at any two positions of the first clock path inclusive of the starting and end points thereof are such that a delay of a set value or near the set value is produced.

First Exemplary Embodiment

A first exemplary embodiment of the present invention will now be described in detail with reference to FIG. 1. FIG. 1 illustrates the circuit configuration of the first exemplary embodiment of a delay control circuit according to the present invention, and FIG. 2 is the timing chart thereof.

As shown in FIG. 1, the delay control circuit includes an input terminal IN supplied with a clock; a first clock path connected to the input terminal IN and provided with a VCDL composed of cascade-connected first variable delay circuits 1 to 8; a second clock path connected to the input terminal IN for supplying a reference clock to a first phase control circuit (PD1+CP1+LPF1); a second variable delay circuit 0; the first phase control circuit (PD1+CP1+LPF1) for matching a phase of a first clock $\overline{B}$, which has been output through the first clock path, and a phase of a second clock A, which has been output through the second clock path, using a control voltage (delay value) VC1 applied to the first variable delay circuits 1 to 8; and a second phase control circuit (PD2+CP2+LPF2) for matching a phase of a third clock C, which is output from the first clock path from any position inclusive of beginning and end points thereof, and a phase of a fourth clock IN, which is output from the starting point of the second clock path, by controlling a control voltage (delay value) VC2 applied to the second variable delay circuit 0.

Figure 2:
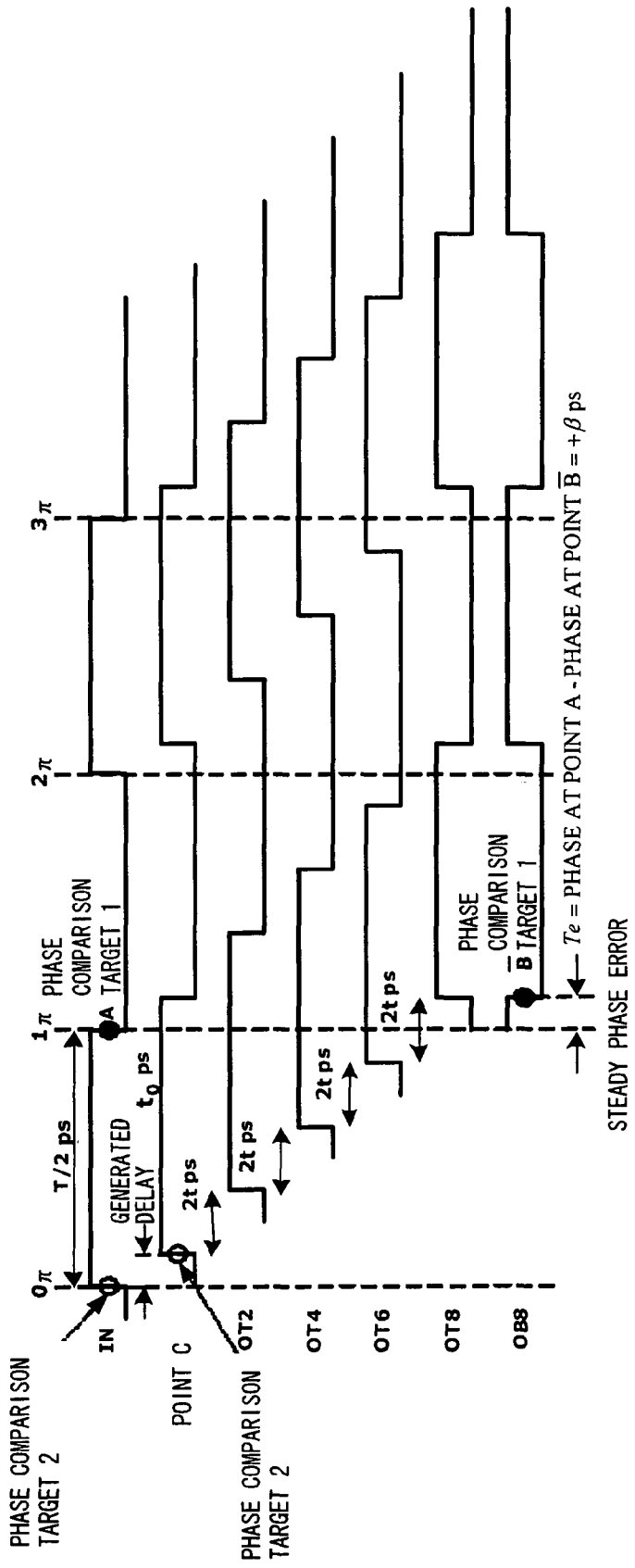
FIG. 2 is a timing chart useful in describing operation of the delay control circuit according to the first exemplary embodiment.

For the sake of expediency in terms of description, only positive-phase outputs (OT2, OT4, OT6, OT8) of the respective variable delay circuits 2, 4, 6, 8 of the VCDL and phase comparison target waveforms (A and $\overline{B}$, IN and C) of the two phase control circuits are shown in FIG. 2. The phase difference of output OTn (n is 1 to 8) from each variable delay circuit of the VCDL is approximately 200 ps, and the complementary output OBn (n is 1 to 8) is opposite in phase with respect to OTn (n is 1 to 8).

In other words, FIG. 2 indicates that phase control is performed based upon a delay (200 ps) obtained by dividing a half period (1600 ps) of the reference clock by the number of stages (eight) of the VCDL, and illustrates the outputs of even-numbered stages of the variable delay circuits of this VCDL.

Further, the first phase control circuit (PD1+CP1+LPF1) and the second phase control circuit (PD2+CP2+LPF2) in FIG. 1 are made identical in terms of circuitry and layout structure, as a result of which these circuits produce outputs having equal characteristics.

Further, phase comparison target(s) 1 in FIG. 2 signifies target(s) for phase comparison by the first phase control circuit, and phase comparison target(s) 2 in FIG. 2 signifies target(s) for phase comparison by the second phase control circuit. That is, these are phase comparison targets for locking the respective phases.

With regard to the phase relationship of steady phase error, a case where delay of the clock path through the VCDL lags with respect to the reference clock path in which the VCDL does not intervene is referred to as "plus-side steady phase error", and a case where delay (or difference) of the clock path through the VCDL leads with respect to the reference clock path is referred to as "minus-side steady phase error" for the sake of expediency in terms of description.

Assume that a steady phase error of +200 ps has been produced by the first phase control circuit (PD1+CP1+LPF1) as shown in the timing chart of FIG. 2. Under these conditions, a similar steady phase error is also produced in the second phase control circuit (PD2+CP2+LPF2). The reason for this is that equal steady phase errors are produced owing to the fact that the two phase control circuits are identical in terms of circuitry and layout structure, as mentioned above.

The second phase control circuit controls the delay of stage 0 of the VCDL, thereby producing the delay (200 ps) shown in FIG. 2. As a result, the total delay time of the variable delay circuits 1 to 8 of the VCDL is prolonged by the amount of the steady phase error (+200 ps) produced by the first phase control circuit. However, since the input clock of the variable delay circuit 1 of the initial stage of the VCDL also is delayed by the amount of the steady phase error (+200 ps) produced by the second phase control circuit, the total delay time of the variable delay circuits 1 to 8 of the VCDL becomes 1600 ps relatively. Accordingly, the phase differences of the outputs (OT1 to OT8 and OB1 to OB8) of the variable delay circuits 1 to 8 of the VCDL are intervals of 200 ps relatively and steady phase error is eliminated.

Second Exemplary Embodiment

Figure 3:
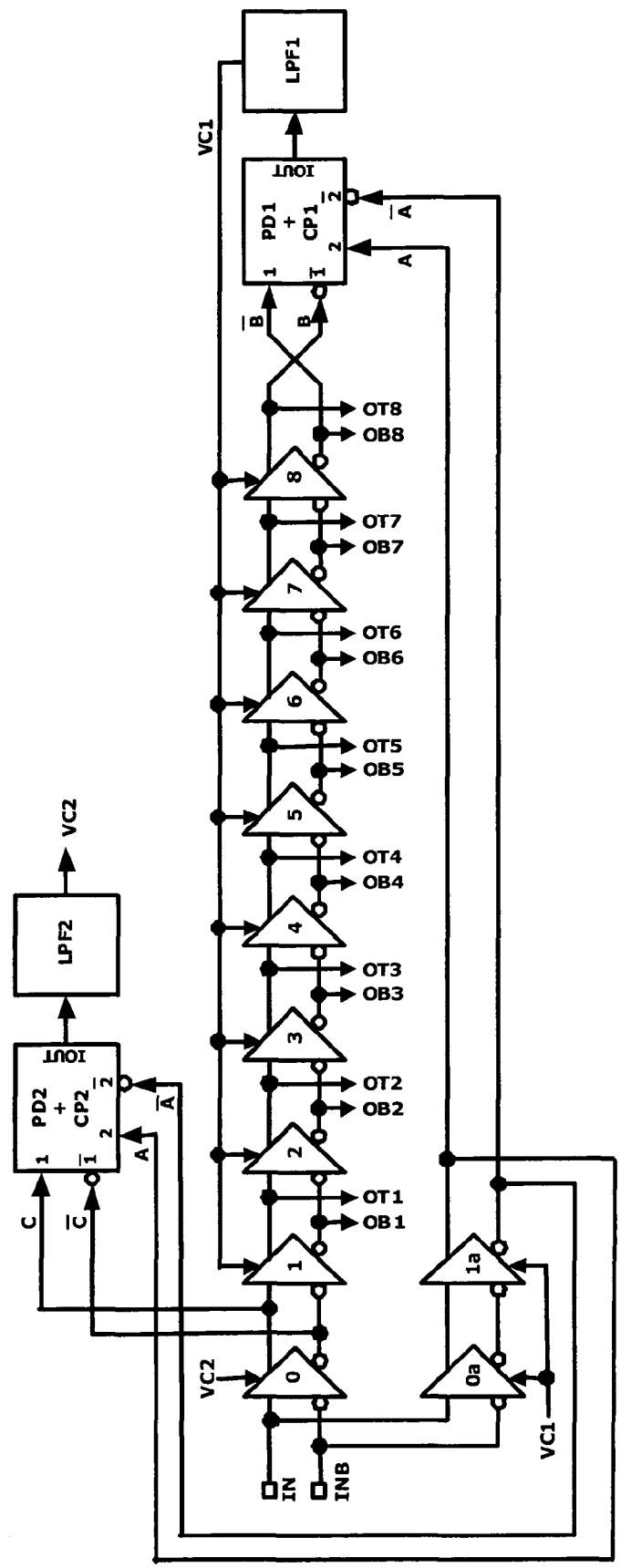
FIG. 3 is a diagram illustrating the circuit configuration of a delay control circuit according to a second exemplary embodiment of the present invention.
Figure 4:
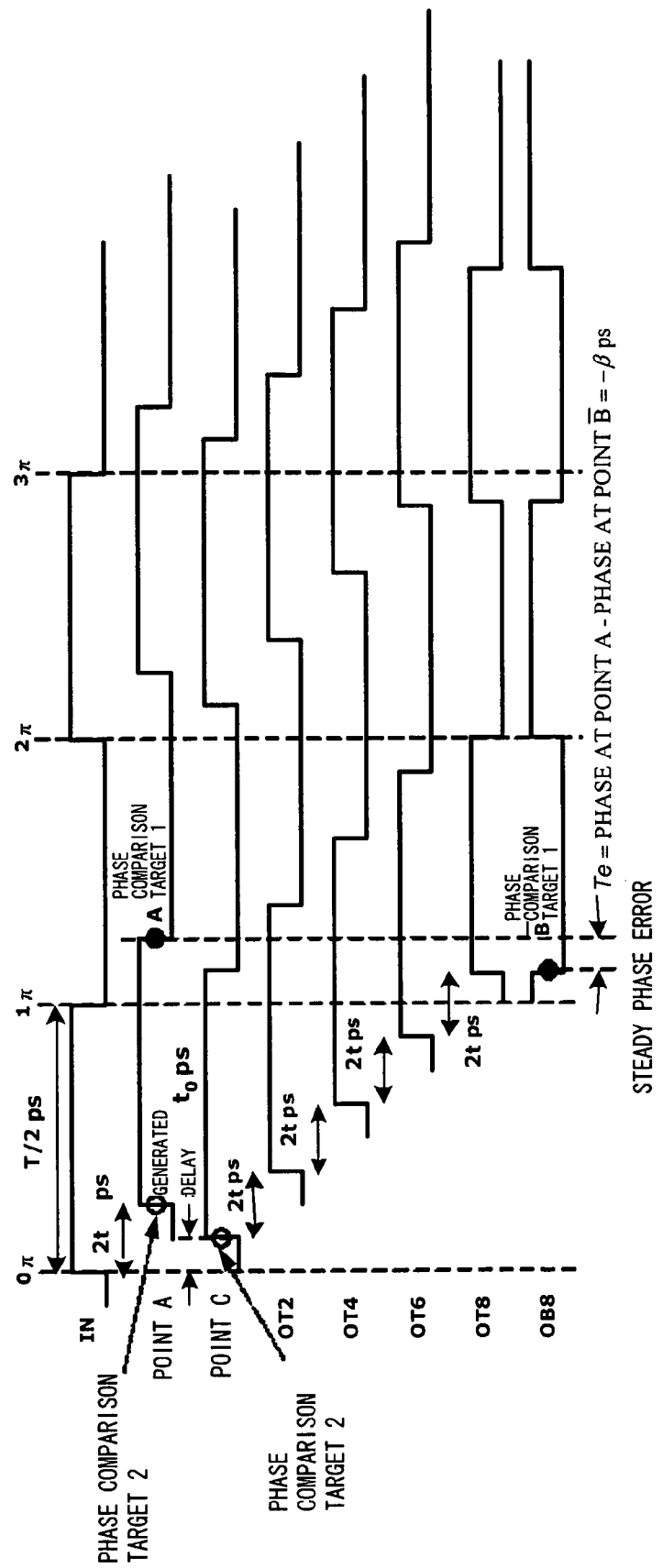
FIG. 4 is a timing chart useful in describing operation of the delay control circuit according to the second exemplary embodiment.

Next, an second exemplary embodiment so adapted that plus- and minus-side steady phase errors can be eliminated will be described. FIG. 3 illustrates the circuit configuration of the second exemplary embodiment of the delay control circuit according to the present invention, and FIG. 4 is the timing chart thereof. The manner of indication in the timing chart of FIG. 4 is the same as that of FIG. 2 and need not be described again.

In the actual circuit, there are cases where the steady phase error produced is not always produced in the plus direction as shown in FIG. 2 owing to variations in power supply, temperature and process manufacture. Accordingly, in the arrangement of FIG. 3, steady phase error can be eliminated regardless of whether steady phase error is in the plus or minus direction.

With reference to FIG. 3, variable delay circuits 0a, 1a controlled by the first phase control circuit have been added to the second clock path to supplement the arrangement of the first exemplary embodiment described above. The functions of the first and second phase control circuits in FIG. 3 are the same as those of the first exemplary embodiment.

Assume that a steady phase error of −200 ps has been produced by the first phase control circuit (PD1+PC1+LPF1) as shown in the timing chart of FIG. 4. Under these conditions, a similar steady phase error is also produced in the second phase control circuit (PD2+CP2+LPF2). The reason for this is that equal steady phase errors are produced owing to the fact that the two phase control circuits are identical in terms of circuitry and layout structure, as mentioned above.

Since the variable delay circuits 0a, 1a in FIG. 3 are supplied with control voltage VC1 in a manner similar to the variable delay circuits 1 to 8 of the VCDL, a delay time of approximately 200 ps is output. At this time the delay of the variable delay circuit 0 is controlled in such a manner that the steady phase error of the second phase control circuit becomes −200 ps, and the delay of the clock that is input to the variable delay circuit 1 constituting the first stage of the VCDL becomes 200 ps (the delay produced at point (mode) C is 200 ps), as illustrated in FIG. 4.

As a result, although the total delay time of the variable delay circuits 1 to 8 in the VCDL shortens by the amount of the steady phase error (−200 ps) produced by the first phase control circuit, the input clock of the variable delay circuit 1 of the VCDL shortens with respect to the phase of variable delay circuits 0a and 1a of the VCDL by the amount of the steady phase error (−200 ps) produced by the second phase control circuit and therefore the total delay time of variable delay circuits 1 to 8 of the VCDL becomes 1600 ps relatively. Accordingly, the phase differences of the outputs (OT1 to OT8 and OB1 to OB8) of the variable delay circuits 1 to 8 of the VCDL are intervals of 200 ps relatively and steady phase error is eliminated.

It should be noted that in FIG. 4, a case where steady phase error is produced in the minus direction is illustrated as a representative example. However steady phase error is eliminated in similar fashion also in a case where steady phase error is produced in the plus direction. In this case, the relative positions of the phase comparison targets 1 and 2 are reversed and a delay of 600 ps is produced at point C. Since it will readily be understood that the steady phase error can be eliminated, this need not be described again.

Further, the delay buffers (0a and 1a of the VCDL) that have been inserted in order to produce a delay difference relative to VCDL0 are merely examples. Effectiveness with regard to eliminating steady phase error would be entirely the same even if a pure delay buffer (a buffer in which delay varies owing to variations in power supply, temperature and process manufacture) that does not utilize a VCDL is employed.

The first exemplary embodiment has an elimination function for a case where steady phase error is produced in the plus direction only, and the second exemplary embodiment has an elimination function for a case where steady phase error is produced in both the plus and minus directions. Preferably, the first exemplary embodiment is utilized in a case where it is known beforehand that steady phase error will appear in the plus direction or in a case where the phase control circuit has been optimized in the process of the designing the circuit in such a manner steady phase error will appear only on the plus side. By adopting the arrangement of the first exemplary embodiment, the addition of delay buffers (the variable delay circuits 0a and 1a in FIG. 3) can be suppressed and it is possible to reduce the overall circuit area and power consumption of the delay control circuit.

Third Exemplary Embodiment

Figure 5:
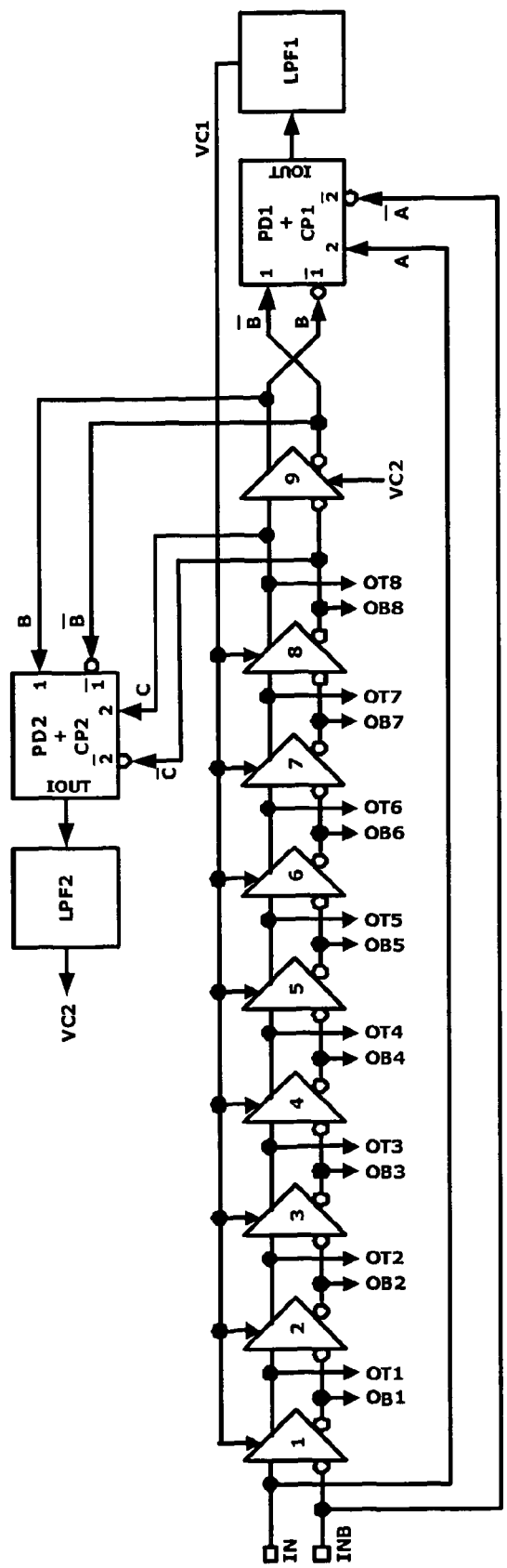
FIG. 5 is a diagram illustrating the circuit configuration of a delay control circuit according to a third exemplary embodiment of the present invention.
Figure 6:
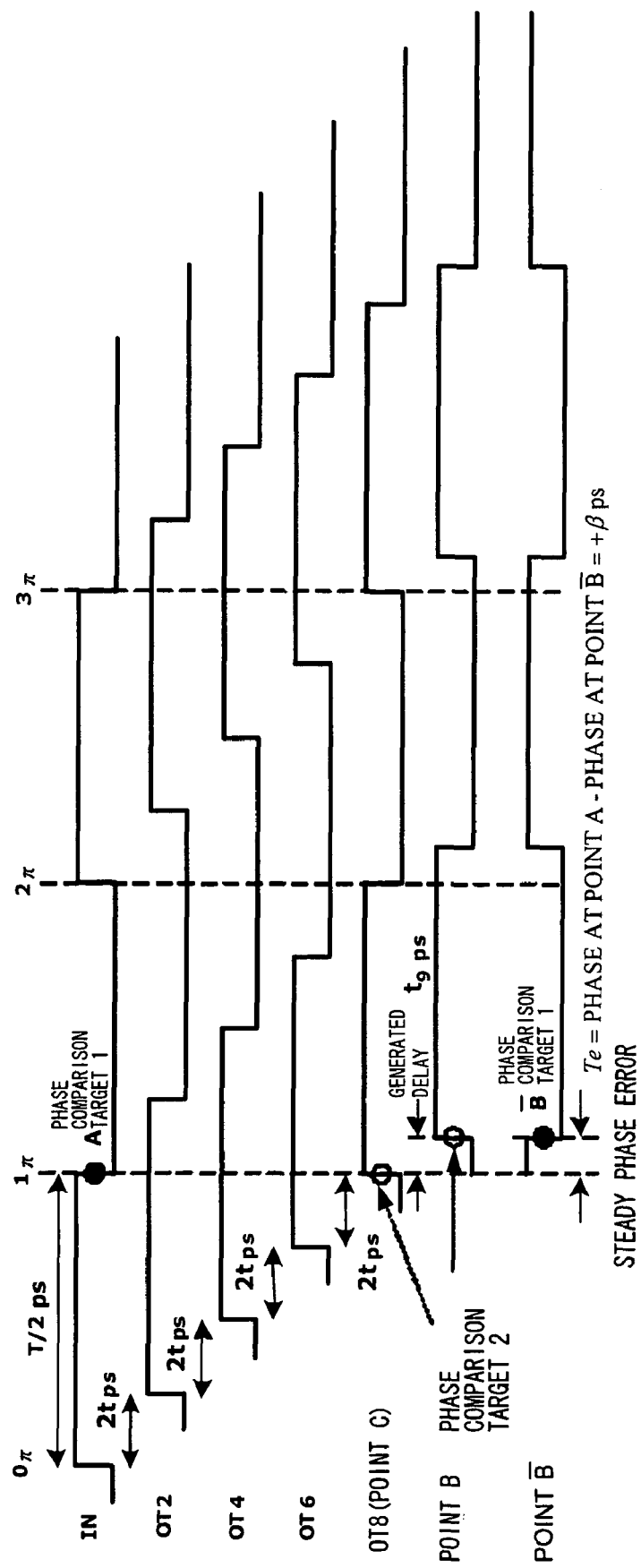
FIG. 6 is a timing chart useful in describing operation of the delay control circuit according to the third exemplary embodiment.

Next, a third exemplary embodiment in which a second variable delay circuit 0 in FIG. 1 is placed as a stage 9 that follows the VCDL will be described. FIG. 5 illustrates the circuit configuration of the third exemplary embodiment of a delay control circuit according to the present invention, and FIG. 6 is the timing chart thereof. The method of indication in the timing chart of FIG. 6 is the same as that of FIG. 2 and need not be described again.

According to the third exemplary embodiment of the present invention as shown in FIG. 5, the second phase control circuit and the variable delay circuit 9 controlled thereby (VC2) are inserted immediately following the variable delay circuits 1 to 8 of the VCDL. Assume that steady phase error of +200 ps has occurred in the first phase control circuit, as illustrated in the timing chart of FIG. 6. Under these conditions, an equal steady phase error is produced also by the second phase control circuit since it has a circuit configuration and layout structure similar to that of the first phase control circuit.

As a result, a delay of 200 ps is produced in the variable delay circuit 9, which has been placed as a stage downstream of the VCDL, as illustrated in FIG. 6, and the total delay time of the variable delay circuits 1 to 8 of the VCDL becomes 1600 ps because the phase has been advanced by 200 ps per stage. Accordingly, the phase differences of the outputs (between OT1 to OT8 and OB1 to OB8) of the variable delay circuits 1 to 8 of the VCDL are intervals of 200 ps relatively and steady phase error is eliminated.

Fourth Exemplary Embodiment

In the third exemplary embodiment described above, the arrangement described is one in which the output (OT8/OB8) of the variable delay circuit 8 constituting the final stage of the VCDL is connected to one input (2/2̄) of the second phase control circuit. However, note that a similar effect is obtained even if this output (OT8/OB8) is connected to the input terminal IN/INB. Next, a fourth exemplary embodiment so adapted that the reference clock of the second clock path is input to the second phase control circuit will be described.

Figure 7:
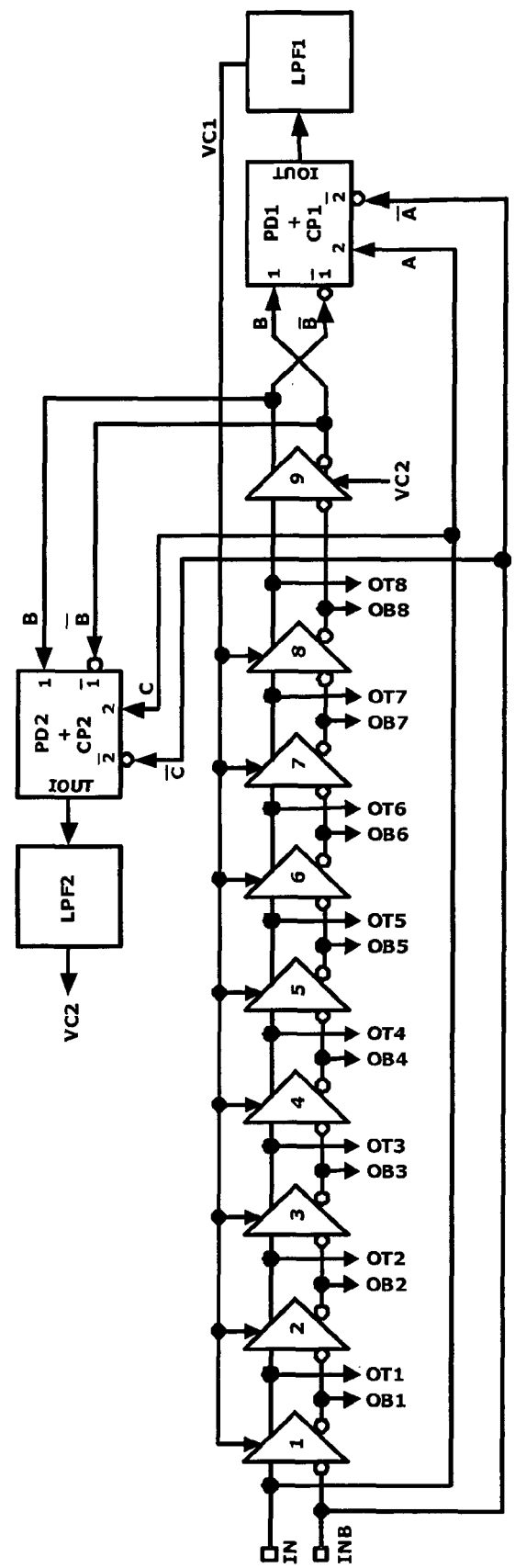
FIG. 7 is a diagram illustrating the circuit configuration of a delay control circuit according to a fourth exemplary embodiment of the present invention.

FIG. 7 illustrates the circuit configuration of the fourth exemplary embodiment of a delay control circuit according to the present invention. The timing chart is similar to that shown in FIG. 6. In this exemplary embodiment also a delay of 200 ps is produced in the variable delay circuit 9 placed as the last stage of the VCDL, and the total delay time of the variable delay circuits 1 to 8 of the VCDL becomes 1600 ps because phase has been advanced by 200 ps. Accordingly, the phase differences of the outputs (OT1 to OT8 and OB1 to OB8) of the variable delay circuits 1 to 8 of the VCDL are intervals of 200 ps relatively and steady phase error is eliminated.

Fifth Exemplary Embodiment

The delay control circuits of the third and fourth exemplary embodiments described above are capable of eliminating steady phase error on the plus side but are not configured to eliminate steady phase error on the minus side. Next, a fifth exemplary embodiment so adapted as to eliminate steady phase error on the minus side will be described.

Figure 8:
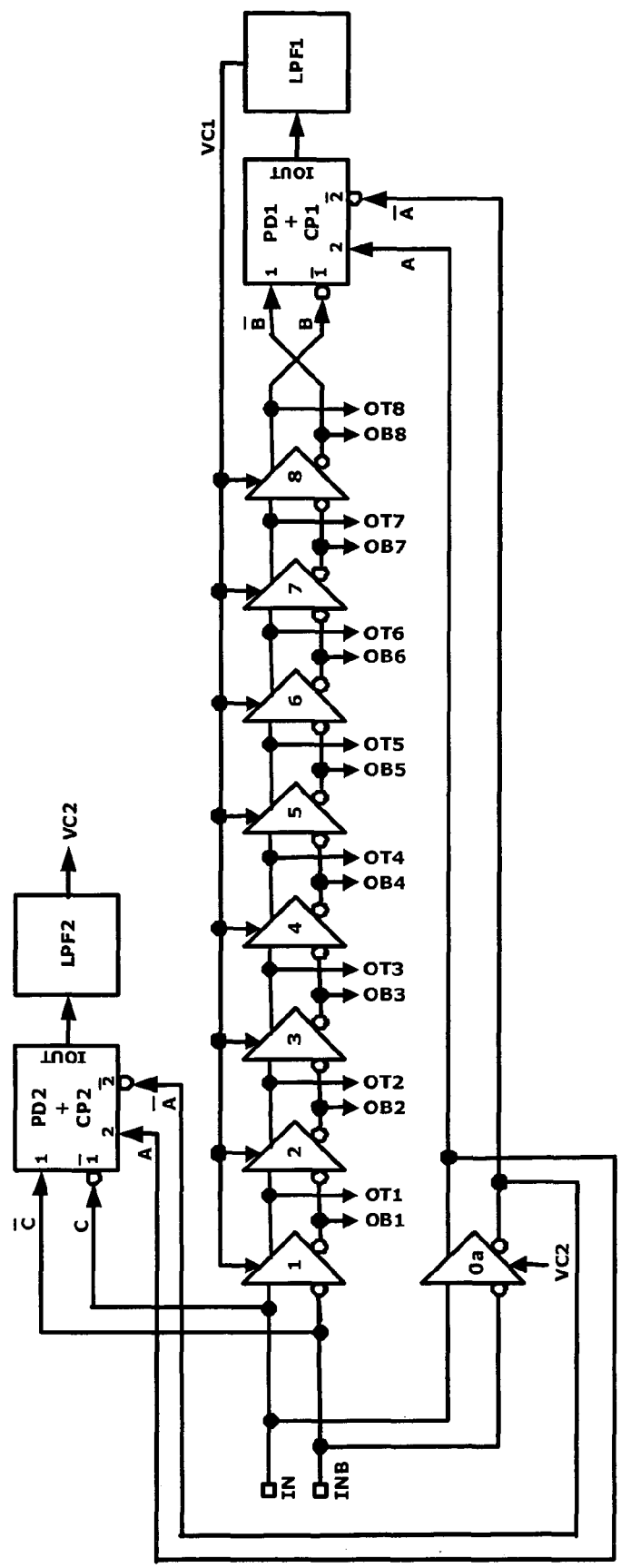
FIG. 8 is a diagram illustrating the circuit configuration of a delay control circuit according to a fifth exemplary embodiment of the present invention.
Figure 9:
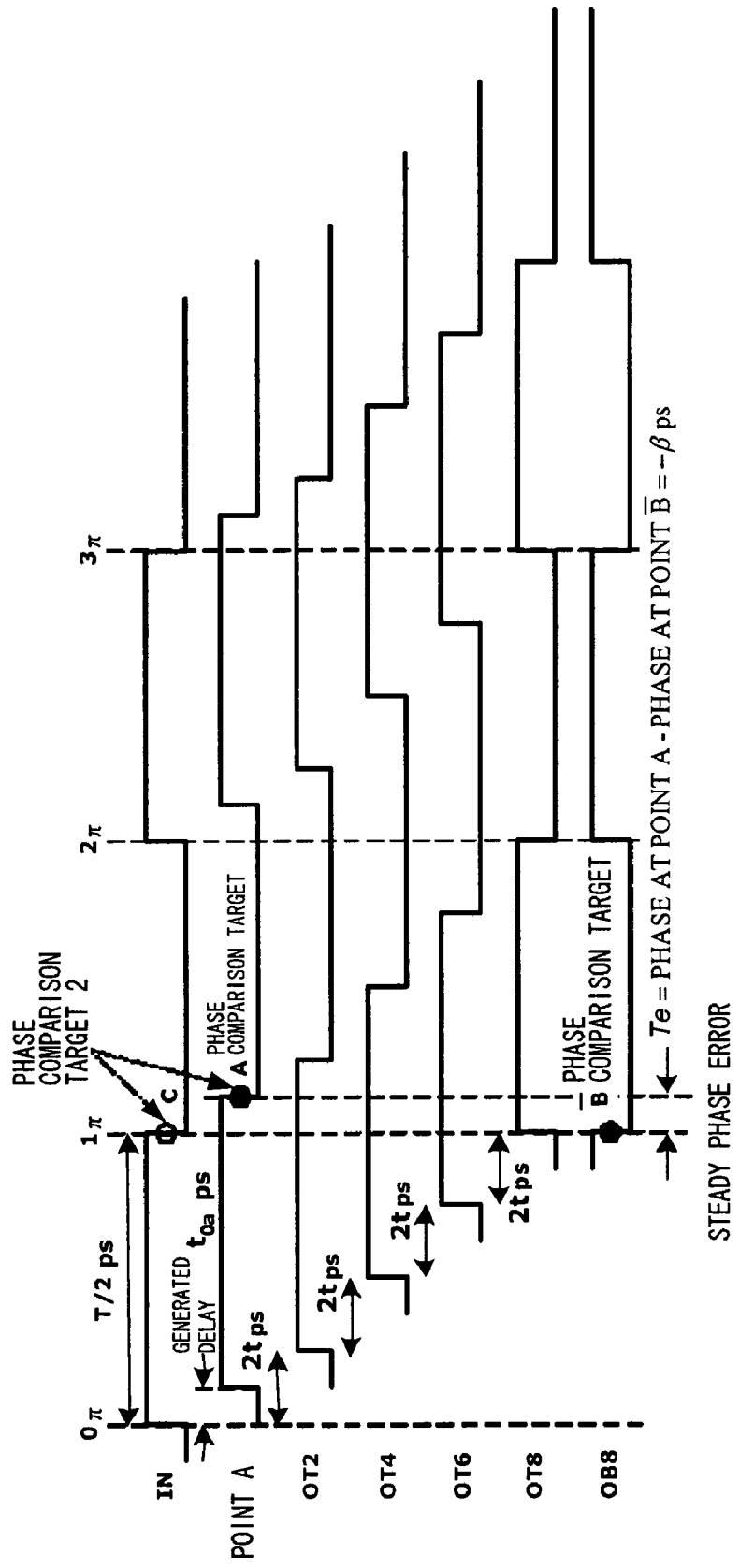
FIG. 9 is a timing chart useful in illustrating operation of the delay control circuit according to the fifth exemplary embodiment.

FIG. 8 illustrates the circuit configuration of the fifth exemplary embodiment of a delay control circuit according to the present invention, and FIG. 9 is the timing chart thereof. In the fifth exemplary embodiment of the present invention, as shown in FIG. 8, the second phase control circuit and the variable delay circuit 0a whose delay is controlled thereby (by the second phase control circuit) are inserted between the input terminal IN/INB and the input (2/2̄) of the first (and second) phase control circuit.

The basic concept and operation of the method of eliminating steady phase error are similar to those of the exemplary embodiments thus far. If reference is had to the timing chart of FIG. 9, it will be evident that steady phase error of the first phase control circuit is eliminated.

Sixth Exemplary Embodiment

Figure 10:
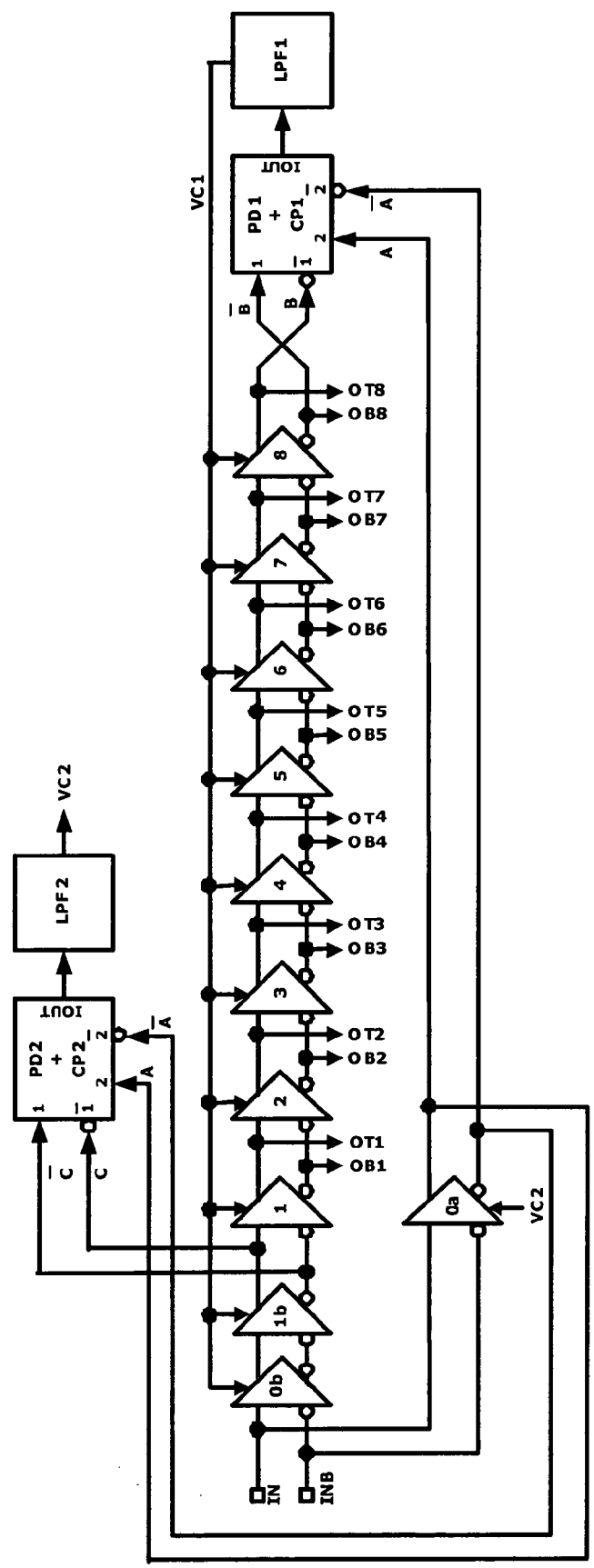
FIG. 10 is a diagram illustrating the circuit configuration of a delay control circuit according to a sixth exemplary embodiment of the present invention.

Next, a sixth exemplary embodiment adapted so that plus- and minus-side steady phase errors can be eliminated will be described. The sixth exemplary embodiment of the present invention is illustrated in FIG. 10. As shown in FIG. 10, the sixth exemplary embodiment is obtained by adding variable delay circuits 0b, 1b in front of the VCDL in the arrangement of the fifth exemplary embodiment described above. The functions of the first and second phase control circuits are the same as those of the fifth exemplary embodiment.

Figure 11:
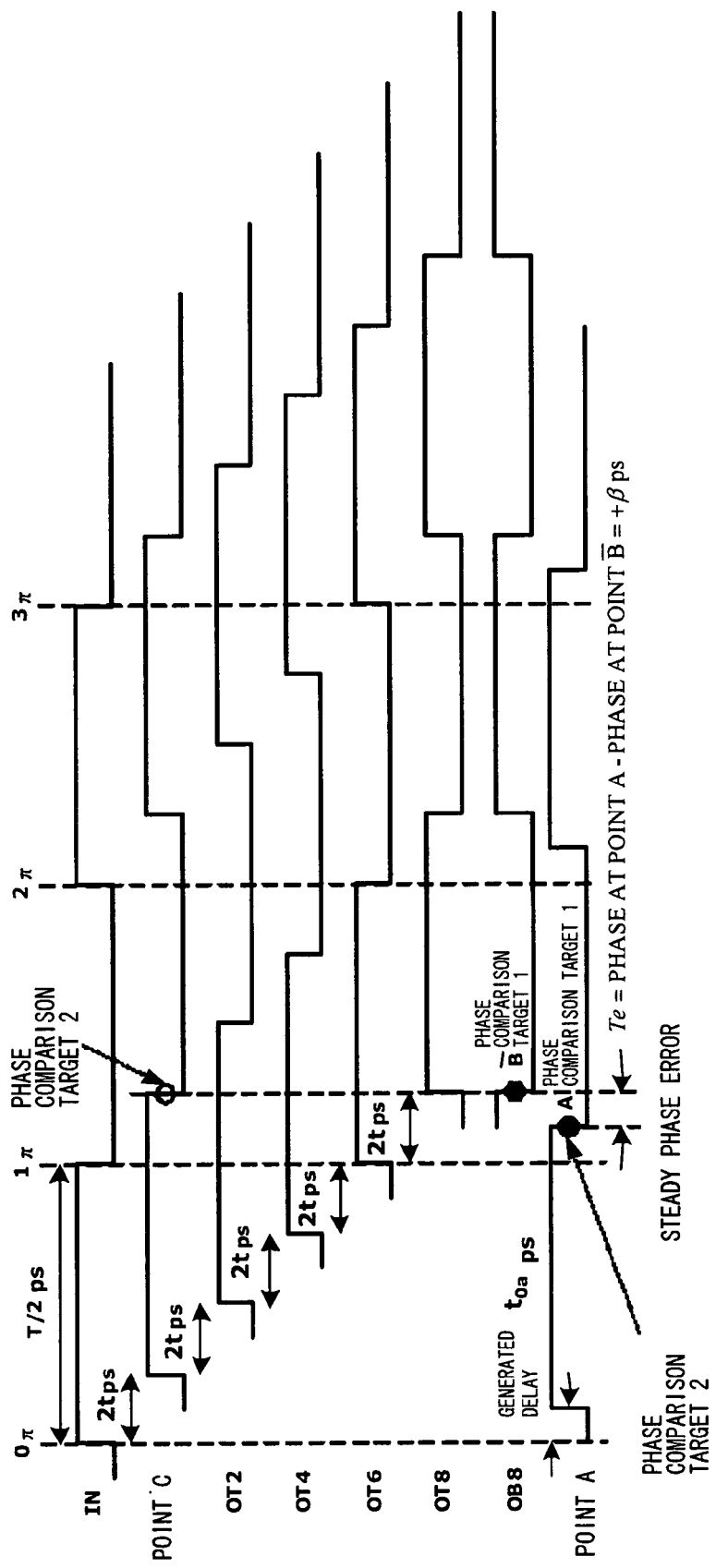
FIG. 11 is a timing chart useful in illustrating operation of the delay control circuit according to the sixth exemplary embodiment.

FIG. 11 is a timing chart for a case where plus-side steady phase error has been produced. The method of eliminating plus-side/minus-side steady phase error and the basic concept and operation thereof are similar to those of the second exemplary embodiment, etc., and are evident from the flowchart of FIG. 11. These not be described again.

Seventh Exemplary Embodiment

Figure 12:
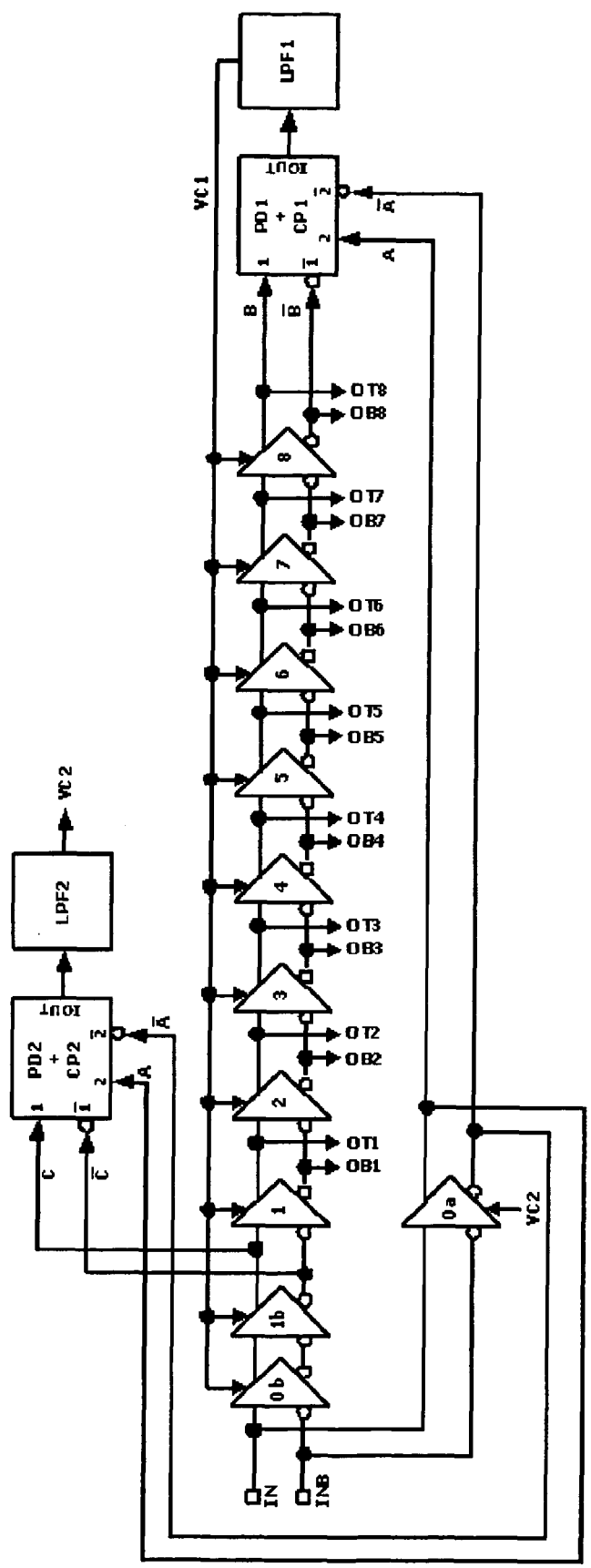
FIG. 12 is a diagram illustrating the circuit configuration of a delay control circuit according to a seventh exemplary embodiment of the present invention.
Figure 13:
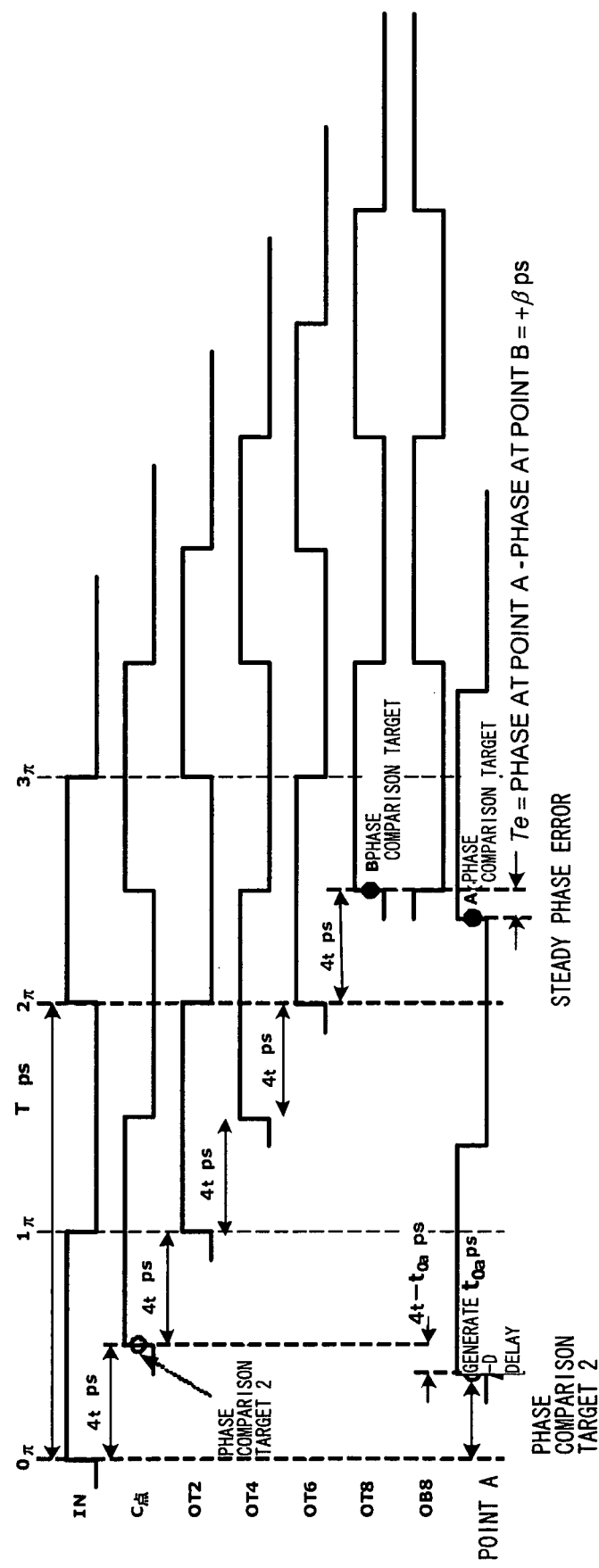
FIG. 13 is a timing chart useful in illustrating operation of the delay control circuit according to the seventh exemplary embodiment.

Next, a seventh exemplary embodiment of the present invention will be described with reference to the drawings. FIG. 12 illustrates the circuit configuration of the seventh exemplary embodiment of a delay control circuit according to the present invention, and FIG. 13 is the timing chart thereof. The seventh exemplary embodiment shown in FIG. 13 is an example in which the phase comparison target is made one period (3200 ps) rather than a half period (1600 ps) and is constructed based upon the sixth exemplary embodiment. This exemplary embodiment differs from the sixth exemplary embodiment in that the phase comparison target changes from a phase of the inverted-phase clock to that of the non-inverted-phase clock by the amount of the change to the edge of one period. For this reason the phase of the clocks supplied to the inputs (1/T) of the first and second phase control circuits in FIG. 12 are made the opposite of that shown in FIG. 10.

The timing chart of FIG. 13 indicates that since delay control is performed in one period, the delay of each variable delay circuit of the VCDL becomes 800 ps, which is twice that of FIG. 11 for the half period. Otherwise, the basic concept and operation of the method of eliminating steady phase error are similar to those of the sixth exemplary embodiment and need not be described again.

Eighth Exemplary Embodiment

Figure 14:
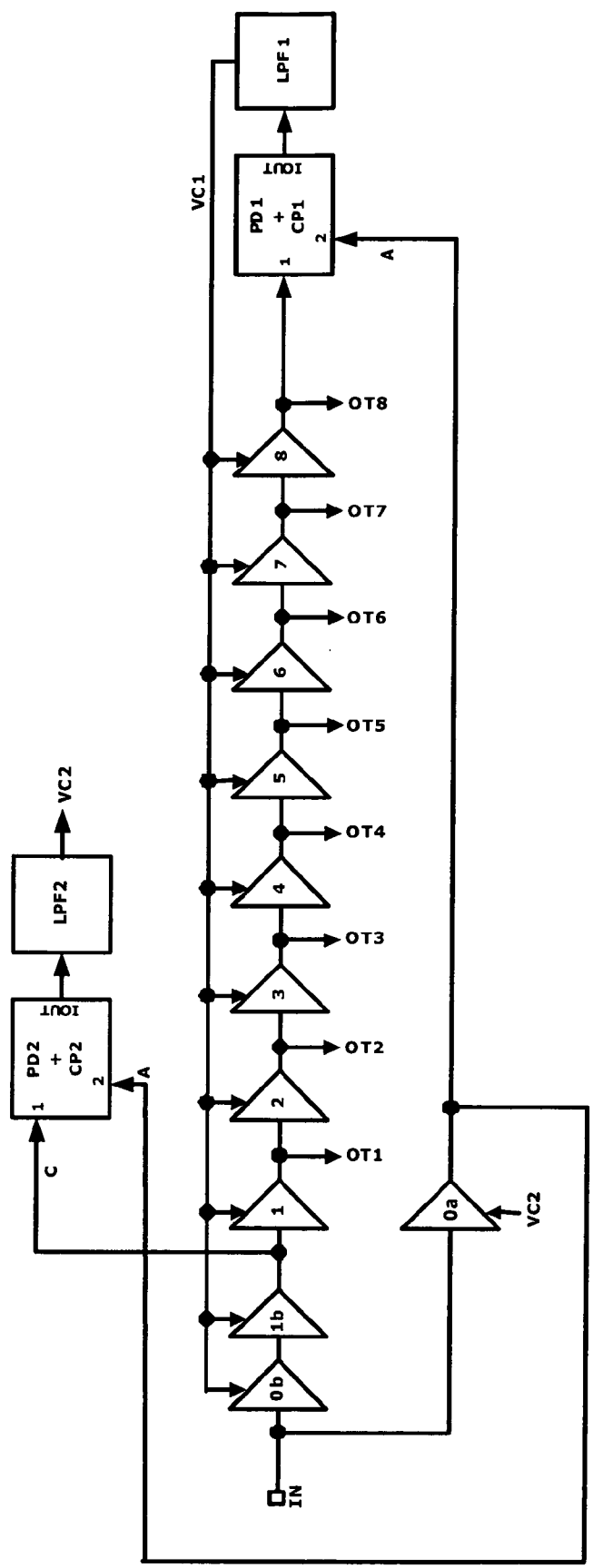
FIG. 14 is a diagram illustrating the circuit configuration of a delay control circuit according to an eighth exemplary embodiment of the present invention.
Figure 15:
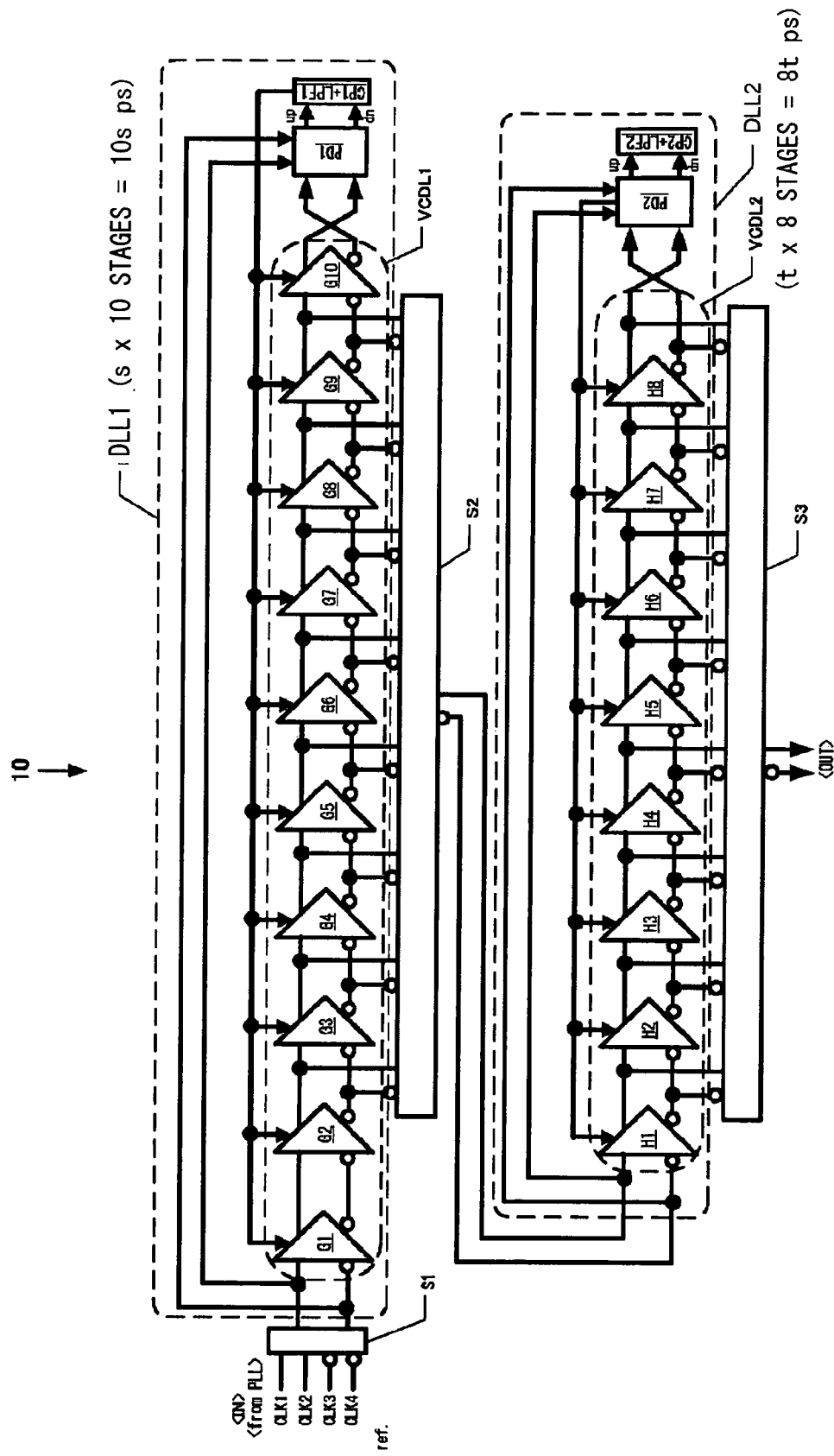
FIG. 15 is a circuit diagram of a digital phase control circuit described in Patent Document 1 as background art.
Figure 16:
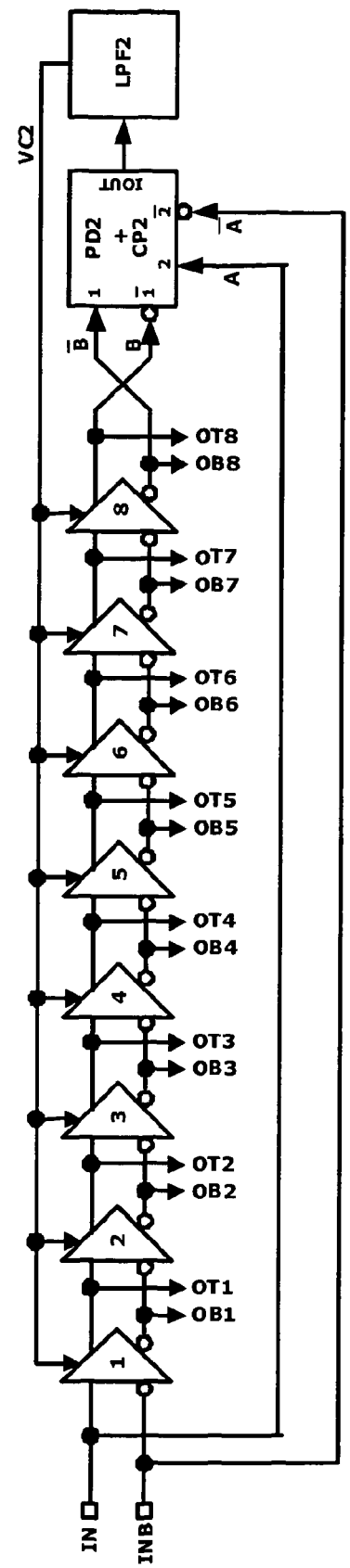
FIG. 16 is a circuit diagram in which DLL2 is excerpted from FIG. 15 for comparative analysis.
Figure 17:
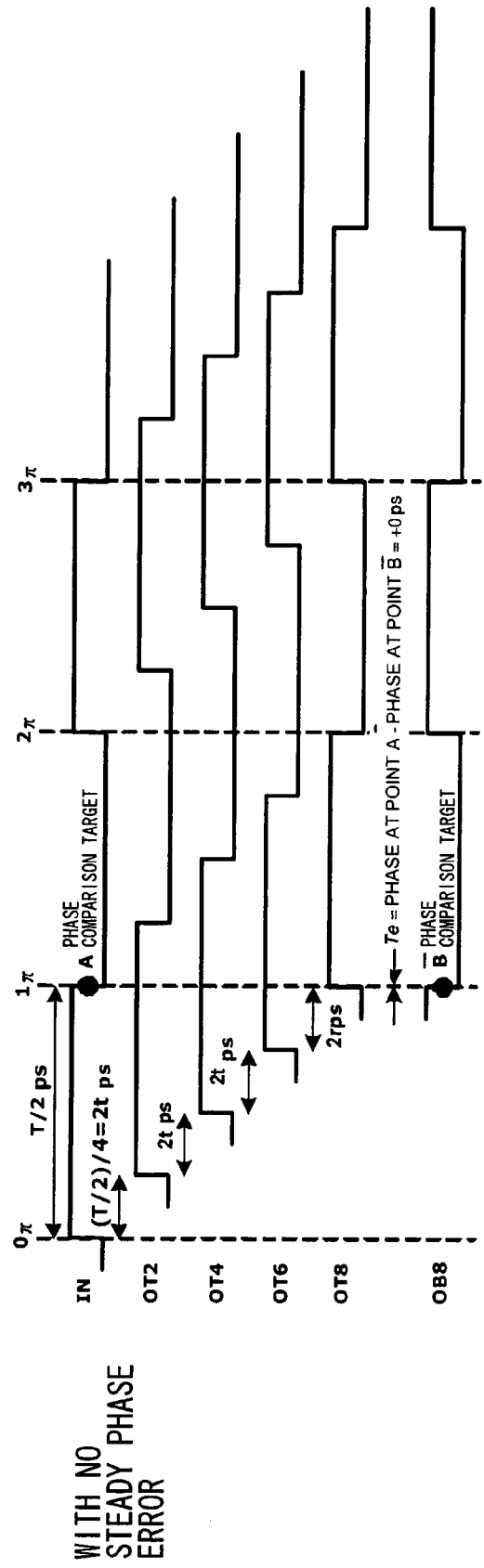
FIG. 17 is a timing chart useful in describing operation of the circuit shown in FIG. 16 for comparative analysis.
Figure 18:
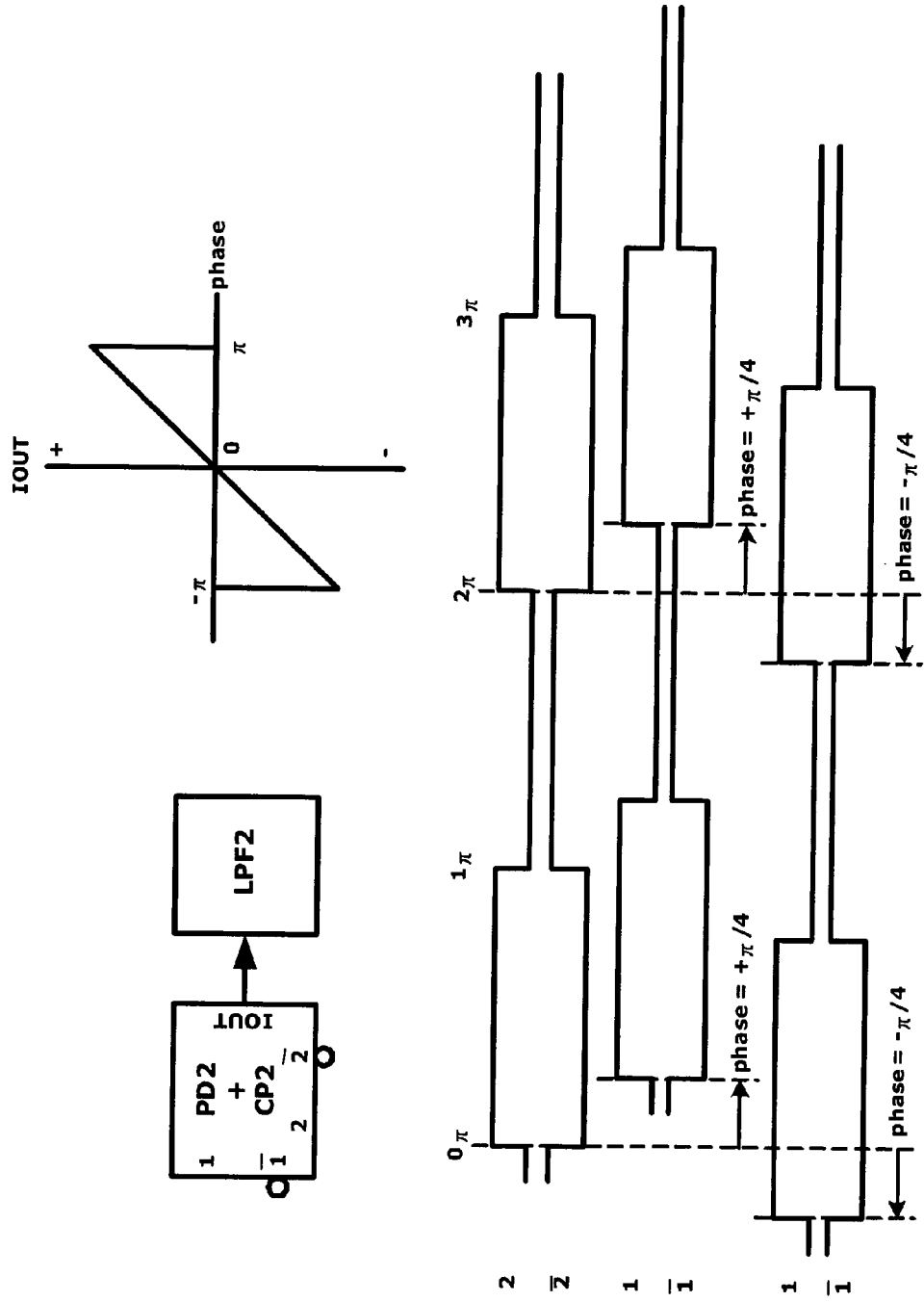
FIG. 18 is a diagram of operation by a phase comparator (PD1) and charge pump (CP1) for comparative analysis.
Figure 19:
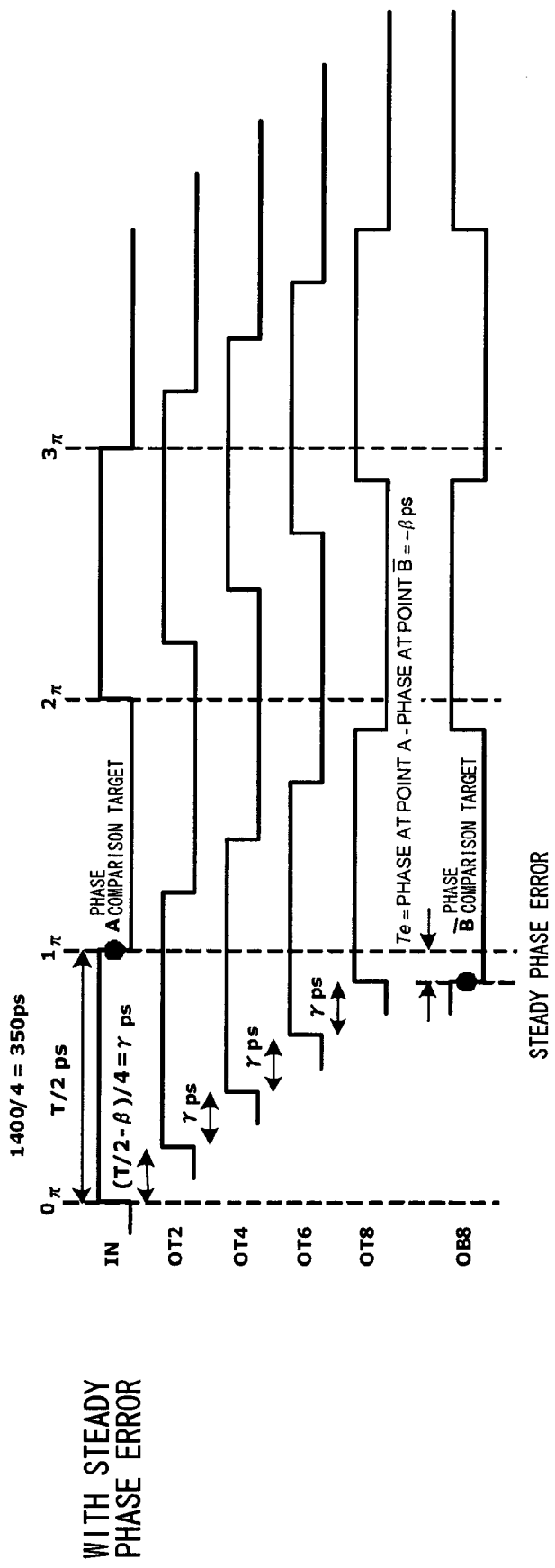
FIG. 19 is a timing chart, for comparison, of a case where steady phase error has occurred in the circuit of FIG. 16.
Figure 20:
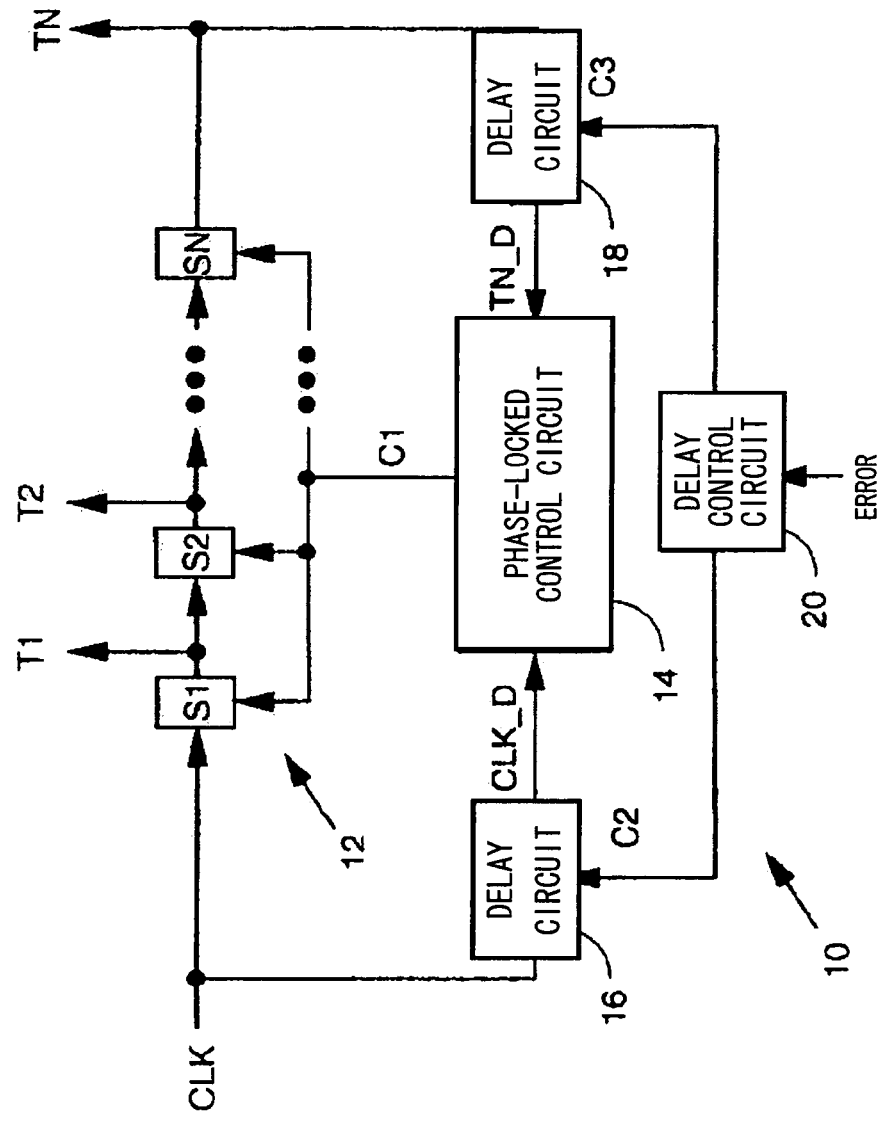
FIG. 20 is a circuit diagram of a timing vernier described in Patent Document 2.

Next, an eighth exemplary embodiment of the present invention will be described with reference to the drawings. The first to seventh exemplary embodiments have been described as operating based upon differential clocks. However, a change can be made to a single-phase configuration. FIG. 14 illustrates the circuit configuration of an eighth exemplary embodiment of a delay control circuit according to the present invention.

The arrangement of FIG. 14 is obtained by adopting a single-phase configuration starting (different) from the variable delay circuits of the sixth exemplary embodiment. Further, if the number of stages of variable delay circuits in FIG. 14 is doubled to 16 stages and the outputs of variable delay circuits 9 to 16 of the succeeding stages are made OB1 to OB8, respectively, then a delay control circuit having a delay difference (resolution) of 400 ps can be obtained, for which the illustration by figures is omitted in light of compact disclosure.

As many apparently widely different exemplary embodiments of the present invention can be made without departing from the spirit and scope thereof, it is to be understood that the invention is not limited to the specific exemplary embodiments thereof except as defined in the appended claims. For example, the first and second phase control circuits in the foregoing exemplary embodiments have been described as having the same circuit configuration and layout. However, suitable modifications can be made to the extent that they do not detract from the effects of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A delay control circuit comprising:
   a first clock path in which a first variable delay circuit is disposed,
   a second clock path in which the first variable delay circuit does not intervene, and
   a first phase control circuit for matching a phase of a first clock that is output from the first clock path with a phase of a second clock that is output from the second clock path, by using a delay value applied to the first variable delay circuit;
   a second variable delay circuit disposed in either one of the first and second clock paths; and
   a second phase control circuit arranged to form a feedback loop to cancel steady phase error produced by the first phase control circuit, with respect to the first clock path or second clock path, by controlling a second delay value applied to said second variable delay circuit.

2. The circuit according to claim 1, wherein said second phase control circuit matches a phase of a third clock, which is output from the first clock path or second clock path from any position inclusive of starting and end points thereof, and a phase of a fourth clock, which is output from said second variable delay circuit, using a delay value of said second variable delay circuit.

3. The circuit according to claim 1, wherein said second variable delay circuit is inserted in the first clock path between the input terminal and the first variable delay circuit, said second phase control circuit is supplied with a third clock and a fourth clock, the third clock being an output clock of said second variable delay circuit, and the fourth clock being an end point of the second clock path.

4. The circuit according to claim 1, wherein said second variable delay circuit is inserted in the first clock path between an output of the first variable delay circuit and the first phase control circuit, said second phase control circuit is supplied with the first clock and third clock, and the third clock is an input clock of said second variable delay circuit.

5. The circuit according to claim 1, wherein said second variable delay circuit is inserted in the second clock path, said second phase control circuit is supplied with a third clock and a fourth clock, the third clock being an input clock of the first variable delay circuit and the fourth clock being an end point of the second clock path.

6. The circuit according to claim 1, wherein a third delay circuit for adjusting the delay of the first clock path is inserted in the first clock path.

7. The circuit according to claim 1, wherein a fourth delay circuit for adjusting the delay of the second clock path is inserted in the second clock path.

8. The circuit according to claim 1, wherein a third delay circuit and a fourth delay circuit have their delays controlled by the first phase control circuit.

9. The circuit according to claim 1, wherein the phase of the it clock or the second clock supplied to the first phase control circuit is nit, where n is an odd number, or $M\pi$, where m is an even number.

10. The circuit according to claim 1, wherein the first variable delay circuit is constituted by x stages, where x is an integer, of delay buffers having identical characteristics, and each delay buffer outputs an output clock.

11. The circuit according to claim 1, wherein a first error delay value produced by said first phase control circuit and a second error delay value produced by said second phase control circuit are substantially equal.

12. The circuit according to claim 1, wherein said first phase control circuit and said second phase control circuit have the same circuit form, the same element dimensions and the same layout.

13. The circuit according to claim 1, wherein delay times at any two positions of the first clock path inclusive of starting and end points thereof are such that a first error delay produced by said first phase control circuit is cancelled by a second error delay produced by said second phase control circuit, and a delay of a set value or near the set value is produced.

14. A method of eliminating steady phase error in a delay control circuit including a first phase control circuit for matching the phase of a first clock that is output from a first clock path in which a first variable delay circuit is disposed and a phase of a second clock that is output from a second clock path in which the first variable delay circuit does not intervene, said method comprising:
matching phases of the first and second clocks by the first phase control circuit using a delay value applied to the first variable delay circuit; and
matching a phase of a third clock, output from the first clock path or second clock path from any position inclusive of starting and end points thereof, and a phase of a fourth clock, output from a second variable delay circuit disposed in either one of the first and second clock paths, by adjusting a second delay value applied to the second variable delay circuit, by a second phase control circuit provided separate from the first phase control circuit, wherein the second phase control circuit cancels steady phase error produced by the first phase control circuit.

15. The method according to claim 14, further comprising:
supplying the second phase control circuit with a third clock and a fourth clock,
wherein the second variable delay circuit is included in the first clock path between an input terminal and the first variable delay circuit,
wherein the third clock is an output clock of the second variable delay circuit, and
wherein the fourth clock is an end point of the second clock path.

16. The method according to claim 14, further comprising:
supplying the second phase control circuit with the first clock and a third clock,
wherein the second variable delay circuit is included in the first clock path between an output of the first variable delay circuit and the first phase control circuit, and
wherein the third clock is an input clock of the second variable delay circuit.

17. A delay control circuit comprising:
a first phase control circuit matching a phase of a first clock signal with a phase of a second clock signal by applying a first control signal to a first variable delay circuit, the first clock signal being output from a first clock path and the second clock signal being output from a second clock path, the first variable delay circuit being disposed on the first clock path, and the first variable delay circuit not intervening in the second clock path;
a second variable delay circuit disposed in the first clock path or the second clock path; and
a second phase control circuit arranged to form a feedback loop to cancel steady phase error produced by the first phase control circuit, with respect to the first clock path or second clock path, by applying a second control signal to said second variable delay circuit.

18. The circuit according to claim 17, wherein the second variable delay circuit is substantially identical to the first variable delay circuit.

19. The circuit according to claim 17, wherein the second variable delay circuit is inserted in the first clock path between an output of the first variable delay circuit and the first phase control circuit, the second phase control circuit is supplied with the first clock signal and a third clock signal, and the third clock signal is an input clock signal of the second variable delay circuit.

20. The circuit according to claim 17, wherein the second phase control circuit matches a phase of a third clock signal and a phase of a fourth clock signal by using a delay value of said second variable delay circuit, the third clock signal being output from the first clock path or second clock path from any position inclusive of starting and end points thereof, and the fourth clock being output from the second variable delay circuit.

* * * * *